United States Patent

Huang

[11] Patent Number: 6,119,460
[45] Date of Patent: Sep. 19, 2000

[54] TEMPERATURE CONTROL SYSTEM FOR TEST HEADS

[76] Inventor: Yun Huang, Blk 610 Yishun Street, 61, #09-217, Singapore, Singapore, 760610

[21] Appl. No.: 09/322,190

[22] Filed: May 28, 1999

[30] Foreign Application Priority Data

May 25, 1998 [SG] Singapore ............................. 9801237

[51] Int. Cl.[7] .................................................. F25B 21/02
[52] U.S. Cl. ................................. 62/3.3; 62/3.7; 136/242
[58] Field of Search .................................... 136/201, 203, 136/242; 62/3.3, 3.7

[56] References Cited

U.S. PATENT DOCUMENTS 5,966,940  10/1999  Grower et al. .............................. 62/3.3

*Primary Examiner*—Kathryn Gorgos
*Assistant Examiner*—Thomas H Parsons
*Attorney, Agent, or Firm*—Christie, Parker & Hale, LLP

[57] ABSTRACT

An effective temperature control system comprising a thermoelectric cooling module which can be reversibly attached to a device to be cooled. The power supply for the cooling module is controlled by a feedback controller which is coupled to a thermosensor. The thermosensor for temperature monitoring is also adapted for reversible attachment to the device to be cooled. The cooling module comprises a hot junction and a cold junction. During operation, heat is transferred from the cold junction to the hot junction. An interface panel is provided at the cold junction to insure good contact with the device to be cooled.

24 Claims, 11 Drawing Sheets

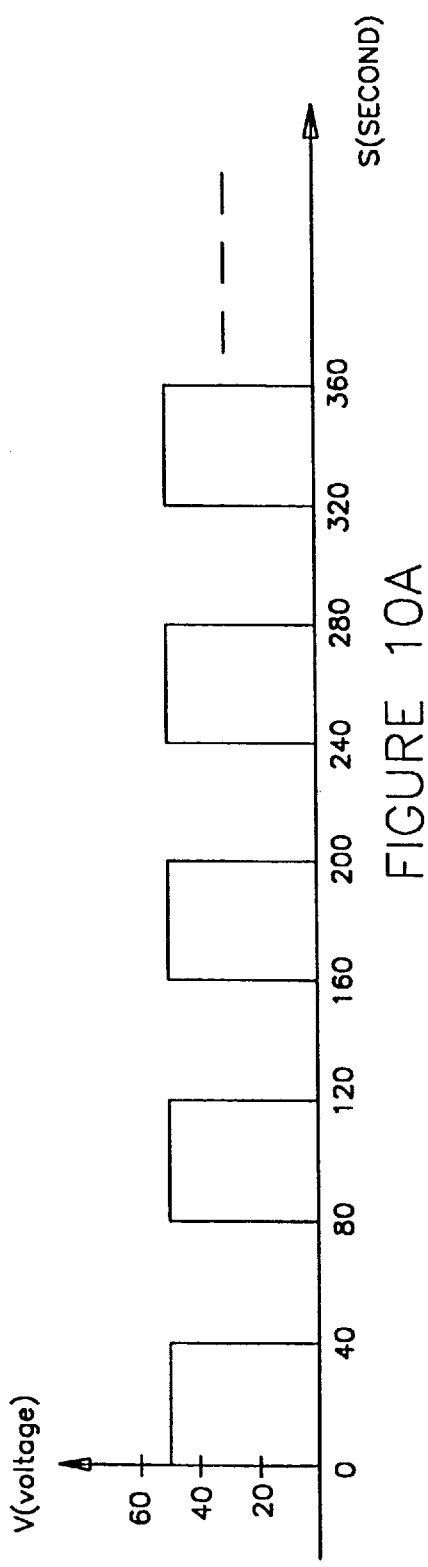
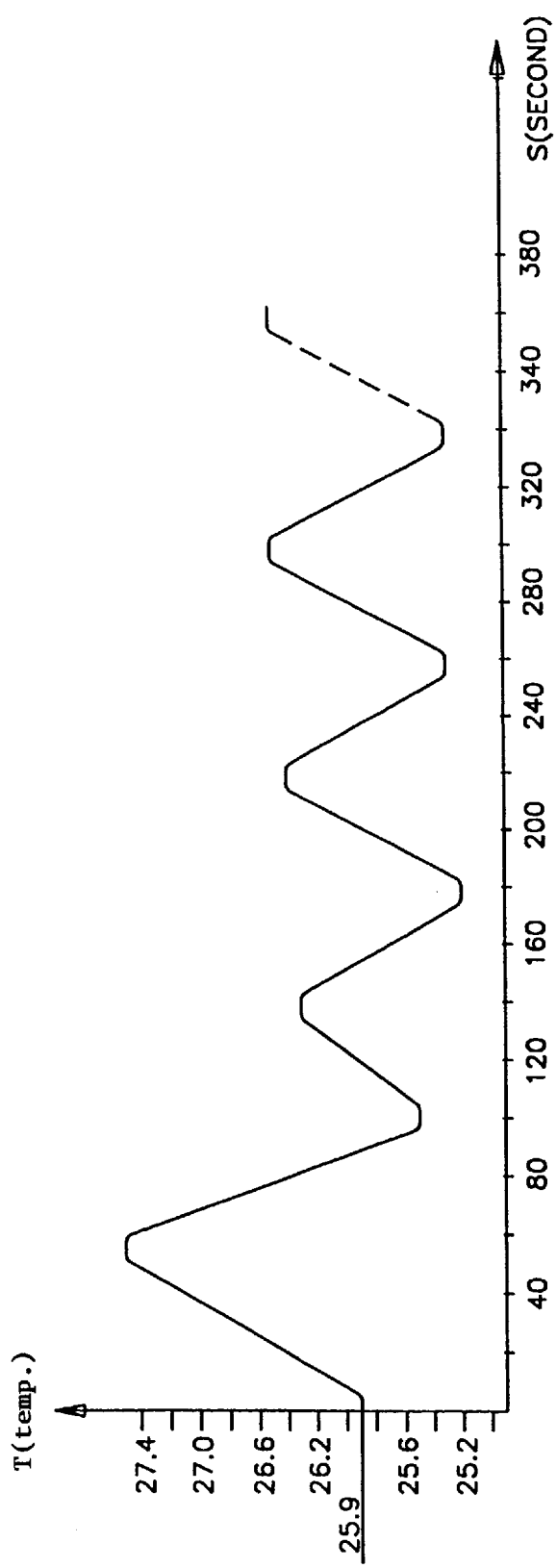
FIGURE 10A
FIGURE 10B

TEMPERATURE CONTROL SYSTEM FOR TEST HEADS

BACKGROUND OF THE INVENTION

1. Field of the Invention

The present invention is related to test heads of test handlers for integrated circuit devices. In particular, the present invention is related to a temperature control system in test heads in test handlers.

2. Description of the Related Art

The new generation of central processing units (CPU) is moving towards larger packages and multi-chip modules such as Organic Land Grid Area. High power consumption, together with the larger size, result in high temperatures within the chip body during operation. In a personal computer system, the CPU is commonly cooled by a fan or a thermoelectric cooling module which is permanently attached to the CPU by a thin film of adhesive such as epoxy. In the area of IC testing, however, the conventional method for cooling a DUT in a test handler is to use a heat sink in conjunction with a fan or compressed air blower at ambient temperatures. In other cases, there are no cooling means provided for cooling the DUT. Ambient temperature refers to the set temperature within the test handler as determined by test requirements.

A typical test head of a test handler comprises the nest and a pneumatic system for pick and place. During the testing process, the DUT is often required to operate at high ambient temperatures, while the body temperature of the DUT must not be overheated. Due to the problems of size and high power consumption as state above, the body temperature of the DUT rises rapidly during testing, resulting in high failure rates for CPU with large energy consumption when the conventional cooling methods are used.

OBJECTS OF THE INVENTION

It is therefore an object of the present invention to provide a controlled heat dissipation system in a test head of a test handler to overcome the shortcomings as stated above.

It is another object of the present invention to provide a detachable heat dissipation system for a test head of a test handler.

It is another object of the present invention to provide a test handler with improved passing rates for CPU devices with large energy consumption.

SUMMARY OF THE INVENTION

The present invention provides an effective temperature control system comprising a thermoelectric cooling module which can be reversibly attached to a device to be cooled. The power supply for the cooling module is controlled by a feedback controller which is coupled to a thermosensor. The thermosensor for temperature monitoring is also adapted for reversible attachment to the device to be cooled. The cooling module comprises a hot junction and a cold junction. During operation, heat is transferred from the cold junction to the hot junction. An interface panel is provided at the cold junction to insure good contact with the device to be cooled. In the preferred embodiment, the thermoelectric cooling module is mounted in the nest of a test head in a test handler for IC devices, with the thermosensor and the interface panel attached to the cold junction. The device under test (DUT) is reversibly attached onto the interface panel and the thermosensor by a suction force. During testing, a rise in the body temperature of the DUT is detected by the thermosensor, and the information is relayed back to the feedback controller. The thermoelectric cooling module is then activated when the temperature is above a predetermined value.

BRIEF DESCRIPTION OF THE DRAWINGS

FIG. 10B shows the temperature change of the DUT under experimental conditions and power input as shown in FIG. 10A with temperature control and an aluminum plate provided between the DUT and the cooling module.

DESCRIPTION OF THE INVENTION

The thermoelectric cooling module of the present invention may be a conventional semiconductor thermal cooling module which gives the Peltier Effect such as the TEC1-7103 from ThermoElectric Cooling America Corporation from Illinois, USA. The cooling module comprises a cold junction which is preferably a flat surface which becomes cold through absorption of energy by electrons as they pass from one semiconductor to another. The energy is transferred to the hot junction which is preferably connected to a heat sink. The heat sink may be any conventional heat sink. The thermosensor may be any conventional temperature sensor, but preferably of the type which is adapted for monitoring the temperature of a flat surface, such as a platinum resistance thermometer. The fan for the heat sink may be a conventional fan or a compressed air pump with the appropriate fluid and thermal transfer capability based on standard heat transfer calculations using the Prandlt, Reynold and Nusselt numbers.

Figure 1:
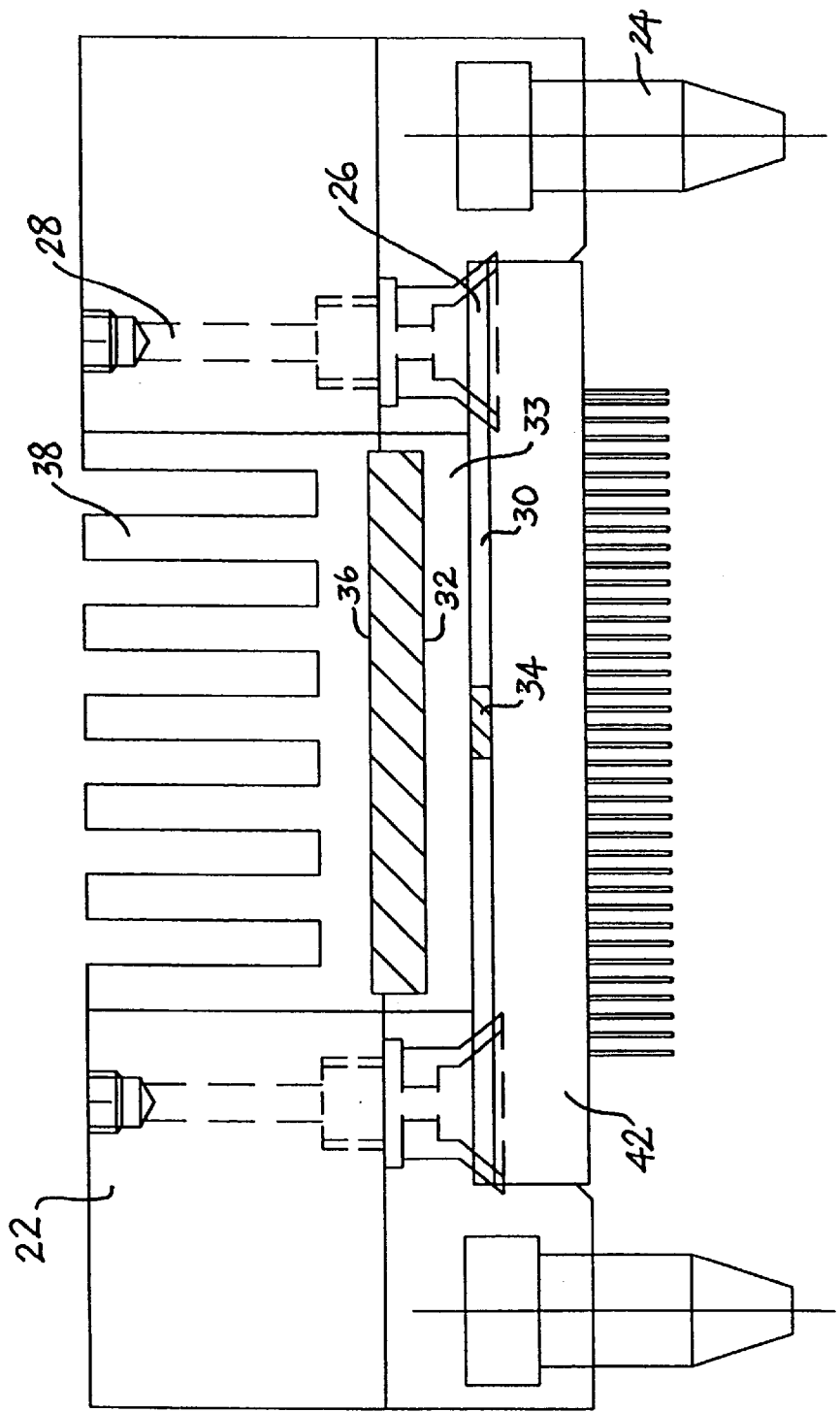
FIG. 1 is a side cross-sectional view of a nest according to one embodiment of the present invention.

The temperature control system according to the present invention may be clearly illustrated with the preferred embodiment of a test handler for IC chips. This handler includes a nest for securing the DUT as shown in FIG. 1. The thermoelectric cooling module is mounted on the nest body 22 which contain pins 24 for guiding, inserting and contact the IC device. Suction cups 26 connected by tunnels 28 to a vacuum and pressured air valve are provided in the nest to pick up and place the DUT. The interface panel in the form of an elastomer sheet, preferably with high heat conductivity 30 is attached to the cold junction 32 of the thermoelectric cooling module via an aluminum plate 33 which acts as a medium for heat flow from the elastomer to the cooling module. A thermocouple 34 is also provided on the aluminum plate 33 and is used as the thermosensor. When the package is picked up by the suction cup, the thermosensor would be sandwiched between the cooling module and the DUT in this example The hot junction 36 of the thermoelectric cooling module is coupled to a heat sink 38 which is in turn cooled by compressed air.

For testing, IC chip 42 is reversibly secured onto the nest directly adjacent the elastomeric sheet and the thermalcouple by suction forces produced by the suction cups. It is preferable that at least four suction cups be used, most preferably one at each corner of the device to provide evenly balanced suction force. It is also important that the center of the device body be in immediate contact with the elastomeric sheet to insure that heat can easily flow out. As specific examples, four suction cups with output diameter of 10 mm and vacuum level of 500 mmHg would give a total suction force of 2.13 Kgf. If the safety factor is 1.5, the net force is 1.42 Kgf. For 15 mm diameter suction cups with a vacuum level of 500 mmHg and a safety factor of 1.5, the net force is 3.20 Kgf. In general, the suction force should be greater than the device weight, and the diameter and number of cups are dependent on the type of device under test.

Figure 2:
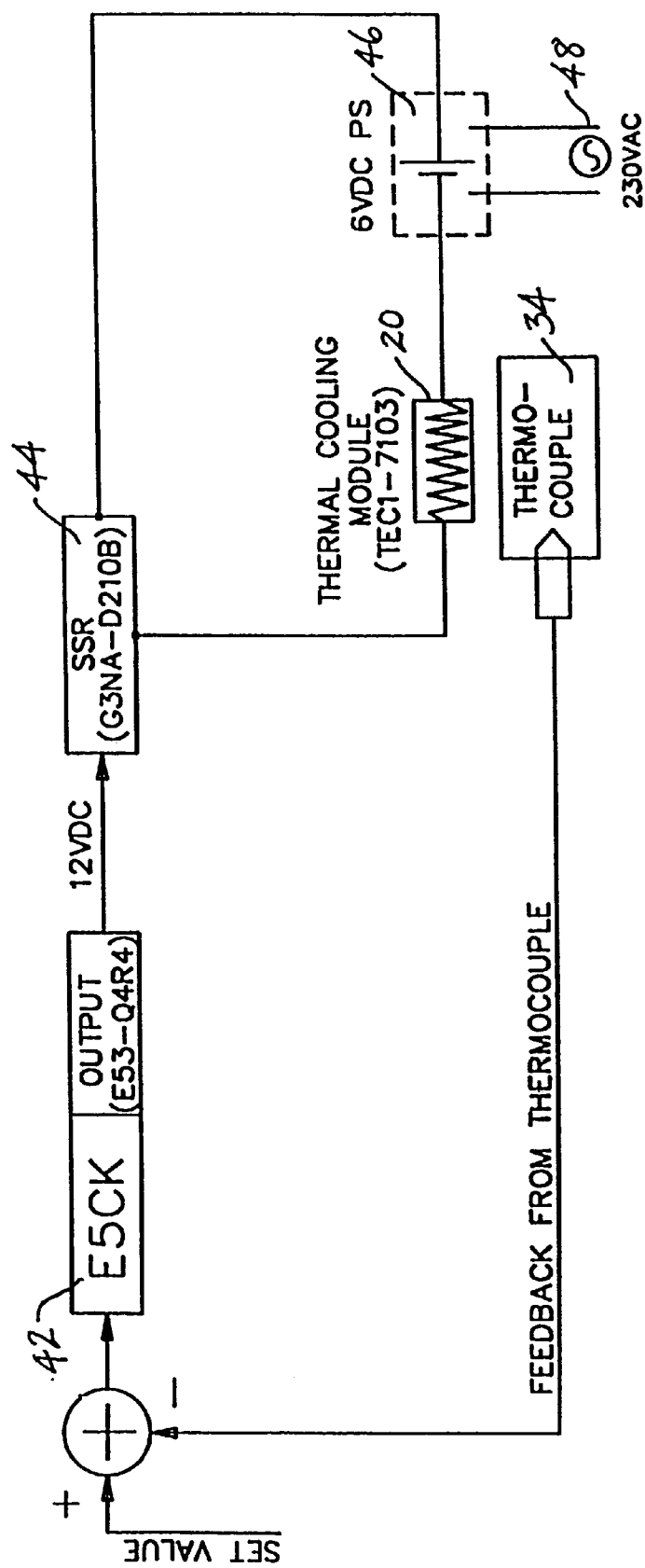
FIG. 2 is a electrical circuit diagram of a temperature controller system according to one embodiment of the present invention.

FIG. 2 shows the circuit diagram of an embodiment of the present invention. The thermosensor 34 monitors the device temperature during testing and feedback to a feedback controller 42. The controller analyzes the feedback signal from the thermocouple and compares it with a predetermined value, and outputs to the driver 44 which power the thermoelectric cooling module 20. The TEC1-7103 thermoelectric cooling module is driven by a 6V DC power supply 46, which is provided via a transformer connected to a 220V AC power source 48. For good temperature control for example of IC packages, the cooling power of the cooling module is preferably much bigger than the power consumed by the package. A suitable cooling module for IC packages with high power consumption includes the TEC1-7103 from ThermoElectric Cooling America Corporation of Illinois, USA.

The following experiments show the effectiveness of the preferred embodiment of the present invention for controlling the temperature of a DUT in a test handler. In these experiments, the heating of an aluminum heat plate is used as the DUT to simulate an IC chip under test. Temperatures referred to in all the figures are in degree celsius unless otherwise indicated.

EXPERIMENT 1

Figure 3A:
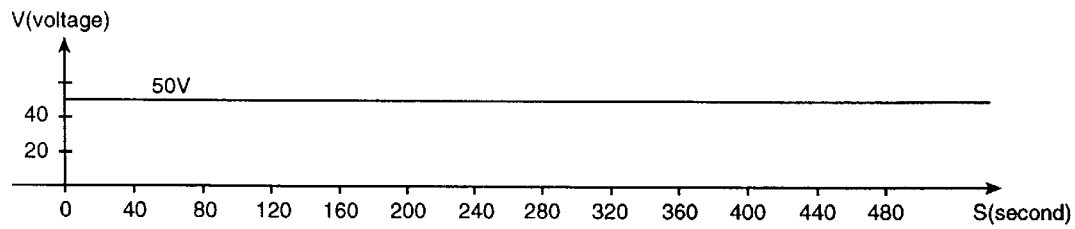
FIG. 3B shows the temperature change of the DUT under experimental conditions and power input as shown in FIG. 3A with temperature control.
Figure 3B:
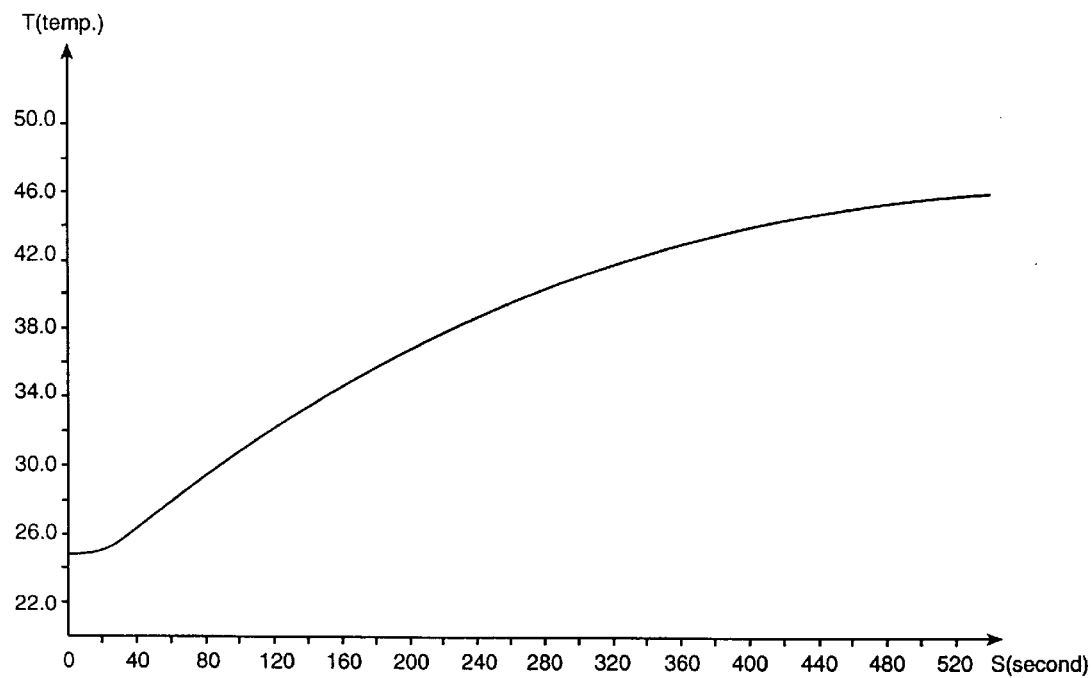

Experiments were first performed to confirm that the cooling module used (TEC1-7103) has the required cooling capacity. The system was set up as shown in FIG. 1, except that an interface panel was not used, and the heating plate was attached via the suction cups directly adjacent the cooling module and the thermosensor. The heat plate was first heated up at a constant 4.4 W (shown in FIG. 3A) without any cooling action. Results of the temperature change of the heater plate are shown in FIG. 3B. Because of the system thermal inertia, the heat plate temperature started a steep rise from ambient temperature several seconds after the heater was switched on. The rate of increases was approximately 0.085° C. per second after the initial period. When the heat plate temperature reached 49° C. 560 seconds later, the temperature was stabilized and the rate of increase was reduced to 0.01° C. per second due to an increased thermal dissipation capacity from the heat plate to the ambient environment.

Figure 4A:
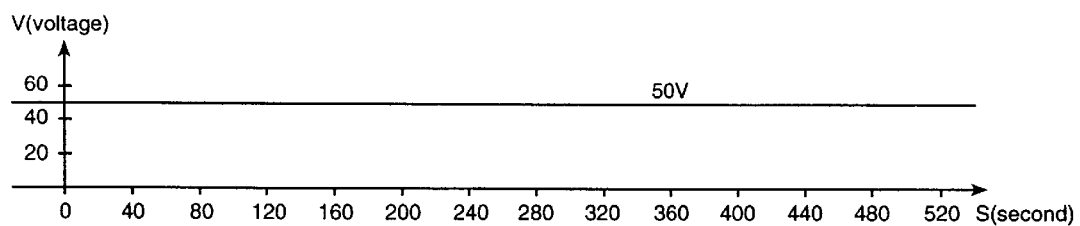
FIG. 4B shows the temperature change of the DUT under experimental conditions and power input as shown in FIG. 4A with temperature control.
Figure 4B:
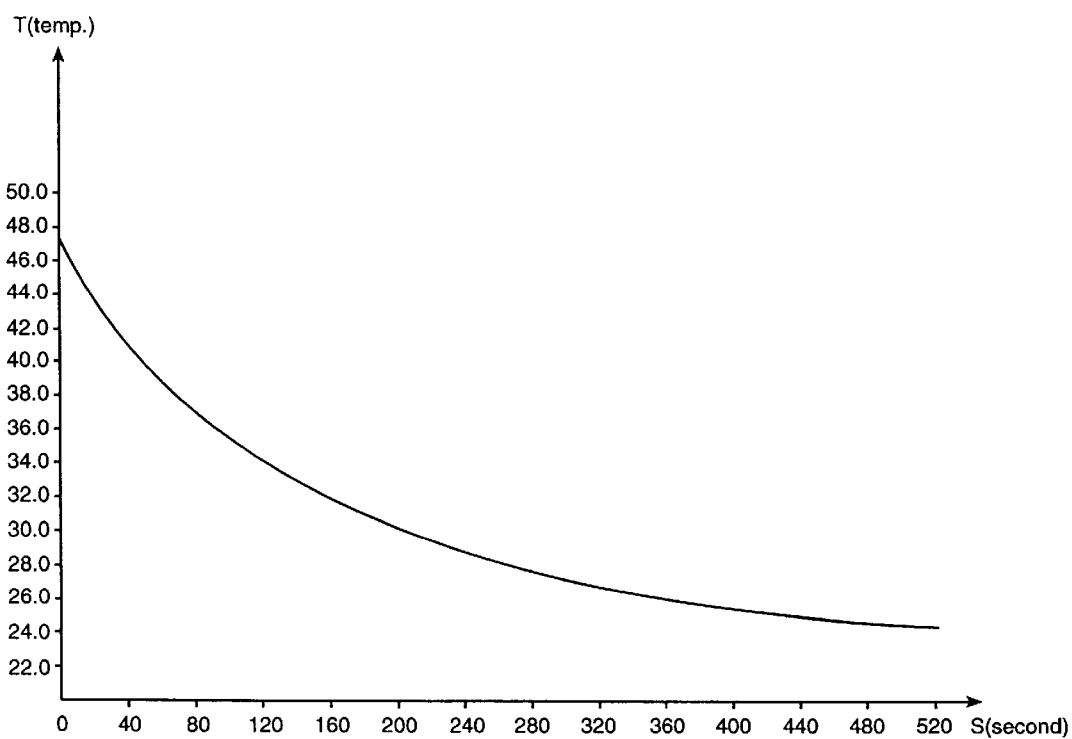

After the heater plate temperature reached 49° C., the temperature control system is activated to control the temperature of the heater plate to a pre-determined ambient value of 24.7° C. with the output of the heat plate maintained at 4.4 W (shown in FIG. 4A). FIG. 4B shows the temperature of the heating plate as the system responded. The temperature fell most rapidly at the beginning at a rate of approximately 0.14° C. per second and then gradually decreased. These results show that the heat generated by the heating plate is rapidly dissipated via the cooling module and the heat sink to the environment. Using precise PID (proportional integrated differential) controls well known in the art, the temperature of the heating plate could be maintained at ambient temperature for 600 seconds without any temperature fluctuations.

Figure 5A:
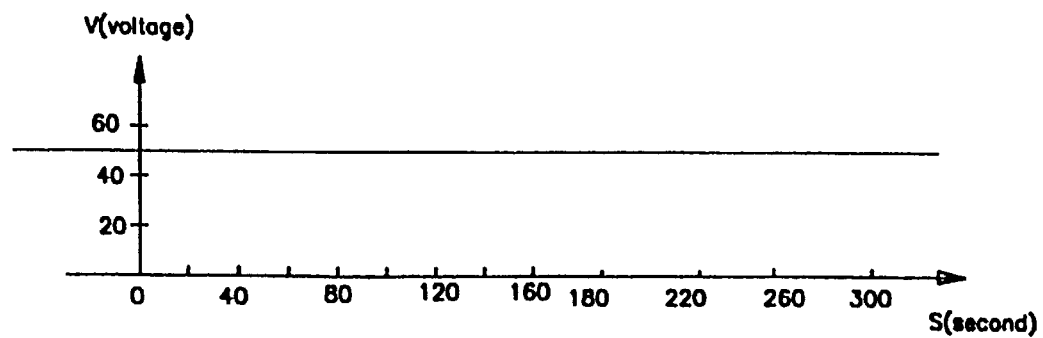
FIG. 5B shows the temperature change of the DUT under experimental conditions and power input as shown in FIG. 5A with temperature control.
Figure 5B:
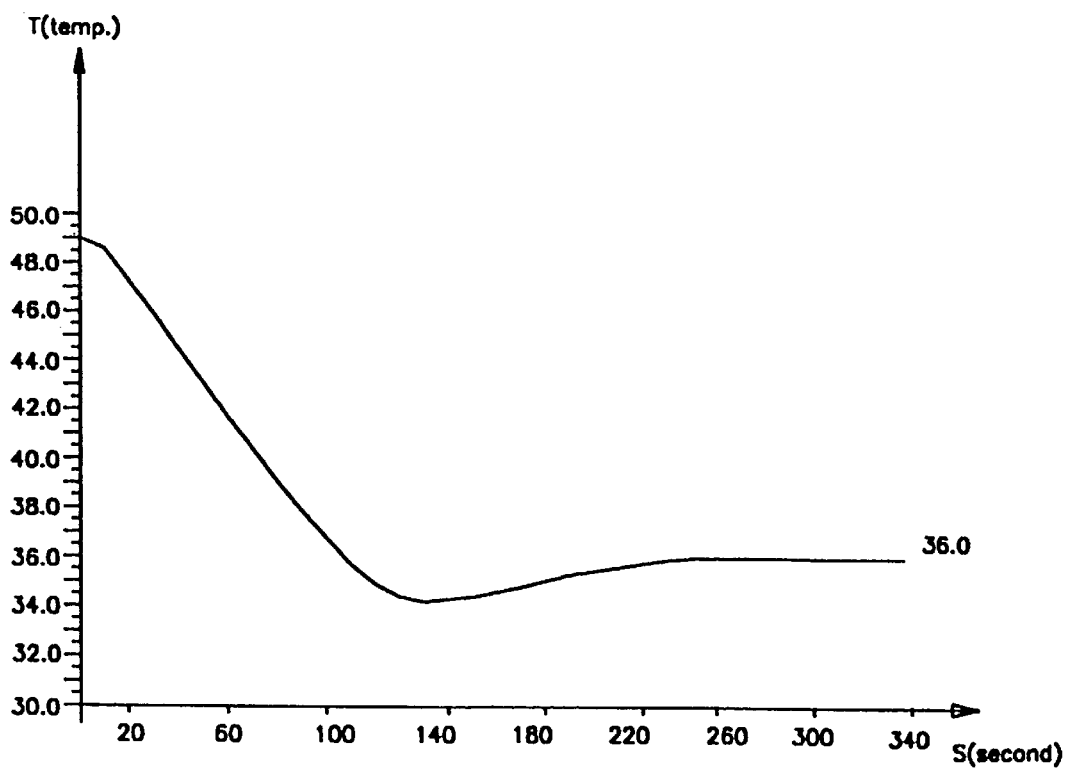

FIG. 5 shows the temperature response of the heat plate when the control point of the system is set at 36° C., which is higher than the ambient temperature, while other testing conditions are kept the same as the previous experiment. The temperature of the heating plate was brought back to the set temperature approximately 240 seconds after the temperature control system was initiated. The profile shown in FIG. 5 is similar to FIG. 4 except that slight overcooling is observed. This overcooling is mainly caused by improper PID parameters, which had been optimized for maintaining ambient temperature and not 36° C.

The results of the tests in this set of experiments shown that the thermoelectric cooling module has the capability to control the heater temperature. It also confirms that the PID parameters of the temperature controller may be determined based on the internal characteristics of the whole thermal system.

EXPERIMENT 2

This set of experiments were conducted to determine how precisely the temperature of the DUT may be maintained when the power consumption of the DUT fluctuates widely. This stimulates actual testing conditions of a test handler as the IC device is switched on and off, and is also subjected to functional tests which require variable output. Again, the heater plate is attached directly to the cooling module without the interface panel. The controller is set at ambient temperature of 23.8° C. before the heating plate was activated.

Figure 6A:
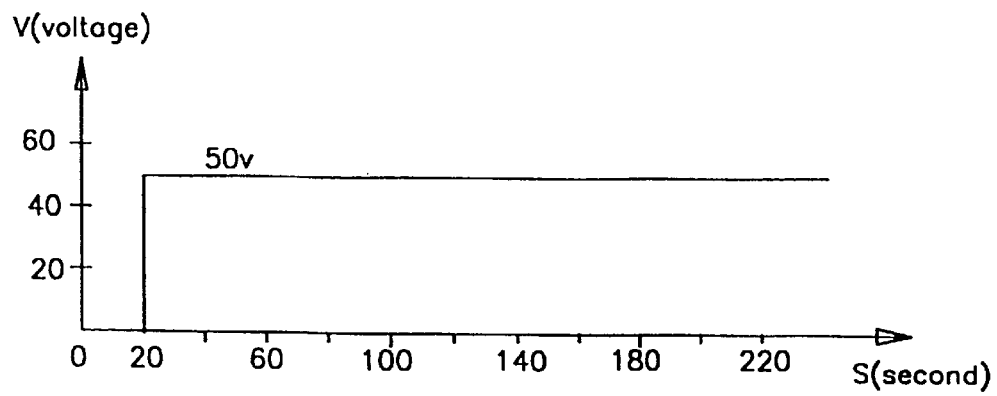
FIG. 6B shows the temperature change of the DUT under experimental conditions and power input as shown in FIG. 6A with temperature control.
Figure 6B:
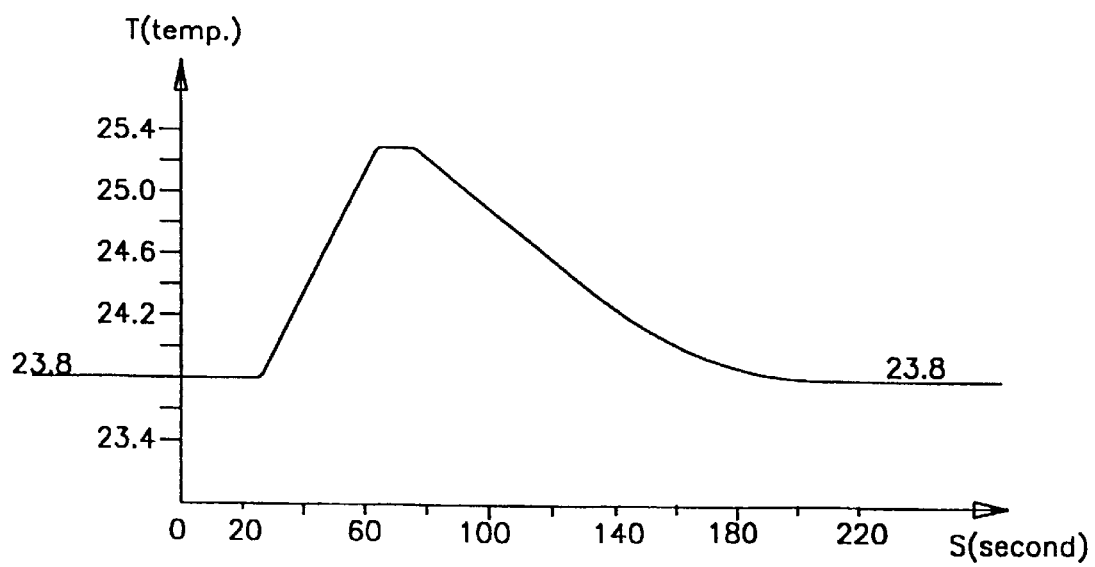

FIG. 6B shows the temperature change of the heating plate corresponding to the power output shown in FIG. 6A. This experiment simulates conditions at the start of the IC testing procedure. At the beginning of this experiment, a state of thermal balance is maintained at ambient temperature, with no power supplied to the heating plate. When a constant 4.4 W output is supplied to the heating plate at 20 seconds, the temperature increased by 1.5° C. in 40 seconds before the control system succeeded in cooling the plate back down to ambient temperature and maintaining equilibrium.

Figure 7A:
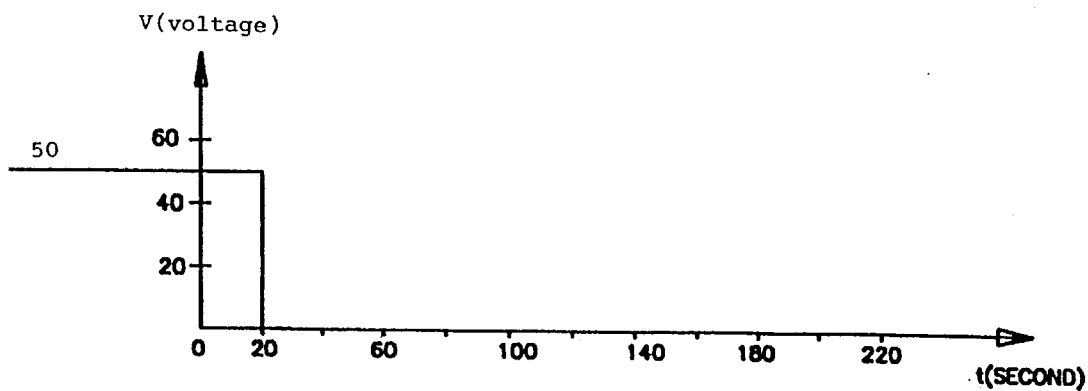
FIG. 7B shows the temperature change of the DUT under experimental conditions and power input as shown in FIG. 7A with temperature control.
Figure 7B:
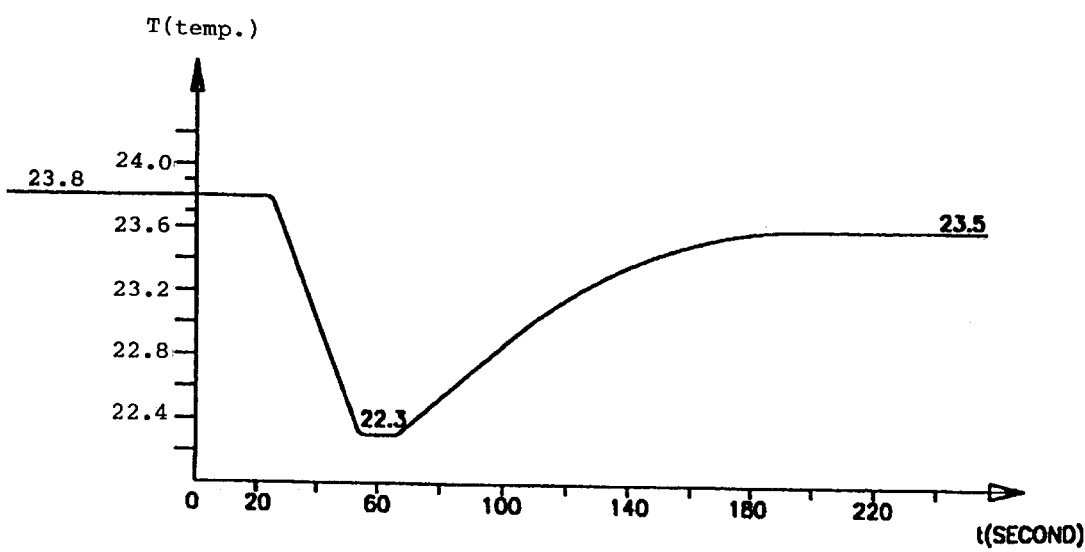

FIG. 7 shows the temperature of the heating plate when equilibrium obtained is interrupted by the cut in power to the heating plate. The cooling module, which has been cooling the heating plate at a constant rate, overcools the plate when the power to the plate is cut off. Plate temperature was cooled to 1.5° C. below the pre-set ambient temperature 32 seconds after power cut-off before it slowly warmed back up to ambient temperature by absorbing environmental thermal energy.

EXPERIMENT 3

Figure 8A:
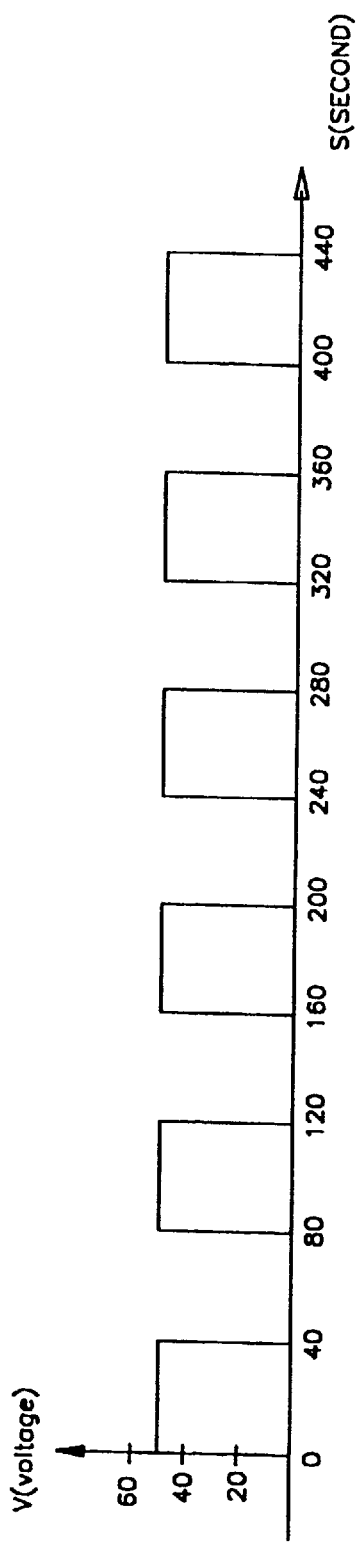
FIG. 8B shows the temperature change of the DUT under experimental conditions and power input as shown in FIG. 8A with temperature control.
Figure 8B:
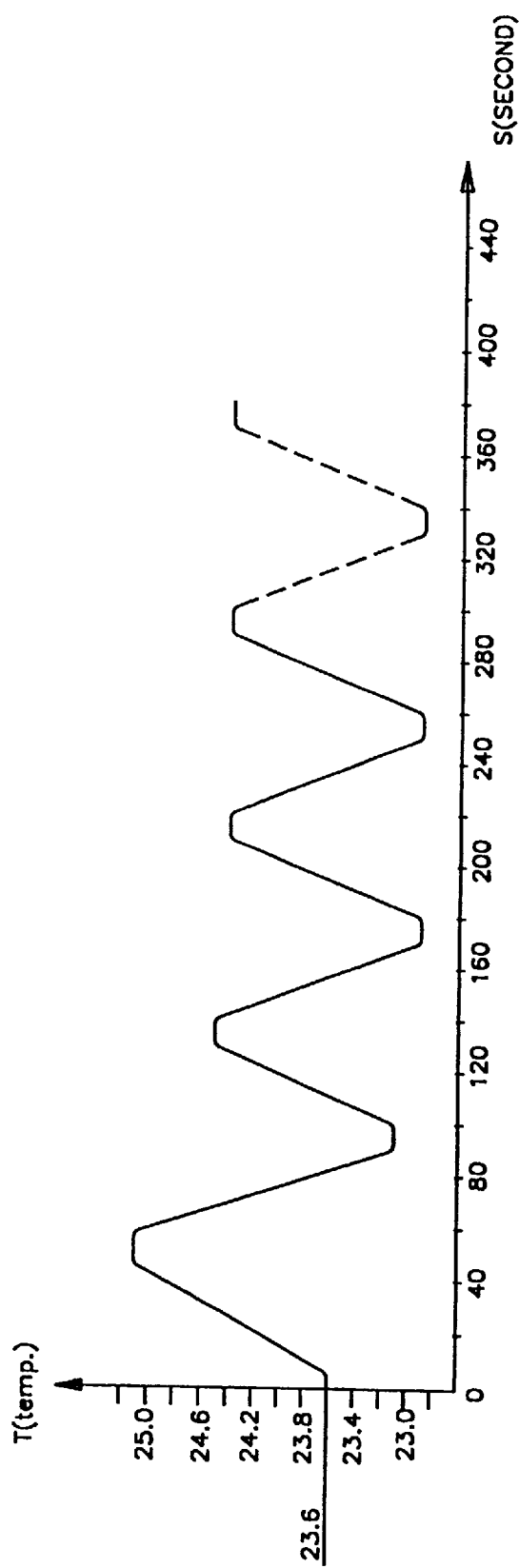

This set of experiment shows how the system responded to power pulses applied to the heating plate. FIG. 8 shows results of an experiment which simulated the starting of the testing, in which a 50V, 4.4 W 40-second power pulse is applied to the heater. This is followed by additional 50V 40-second pulses at 40-second intervals. The system was initially controlled at ambient temperature of 23.6° C., and when the power pulse was switched on, the initial ambient thermal balance is interrupted and the temperature of the heater plate rose to 25.1° C., which is 1.5° C. higher than the pre-determined value. At the end of the 40 second power pulse, the temperature of the heater plate was slowly reduced to 23.1° C., and continued to fluctuate between 0.8° C. higher or lower than the ambient temperature in response to the power pulses.

Figure 9A:
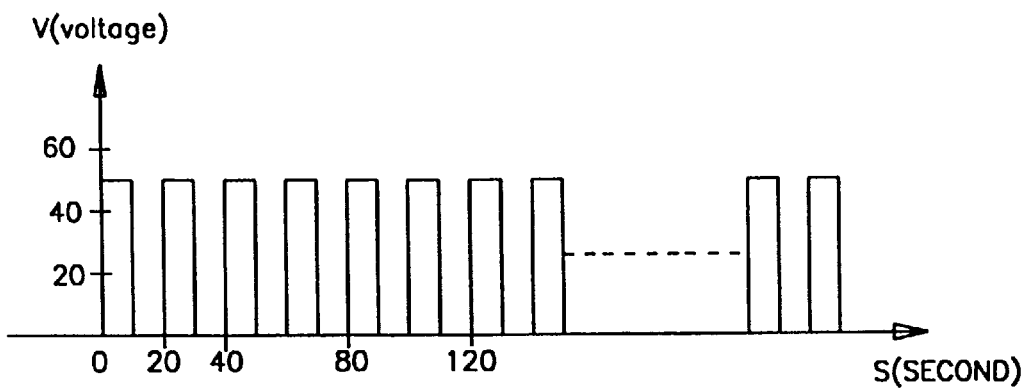
FIG. 9B shows the temperature change of the DUT under experimental conditions and power input as shown in FIG. 9A with temperature control.
Figure 9B:
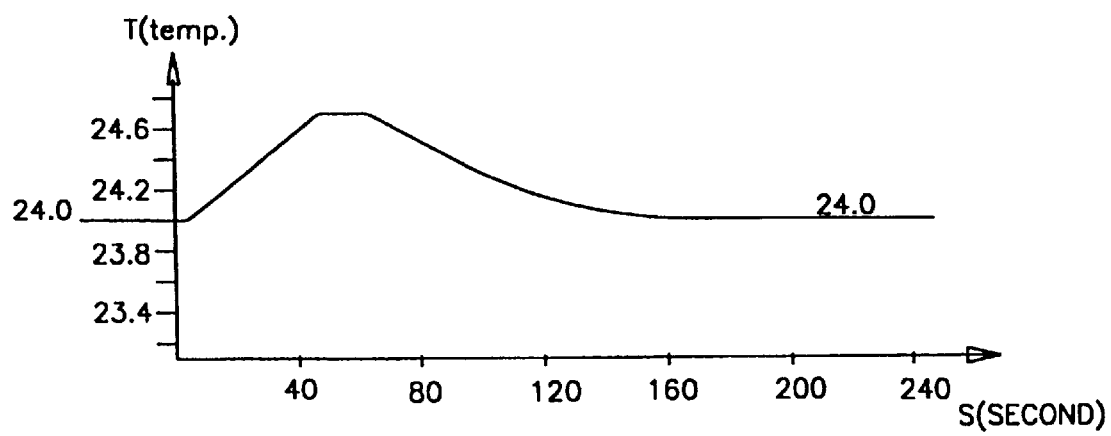
Figure 11A:
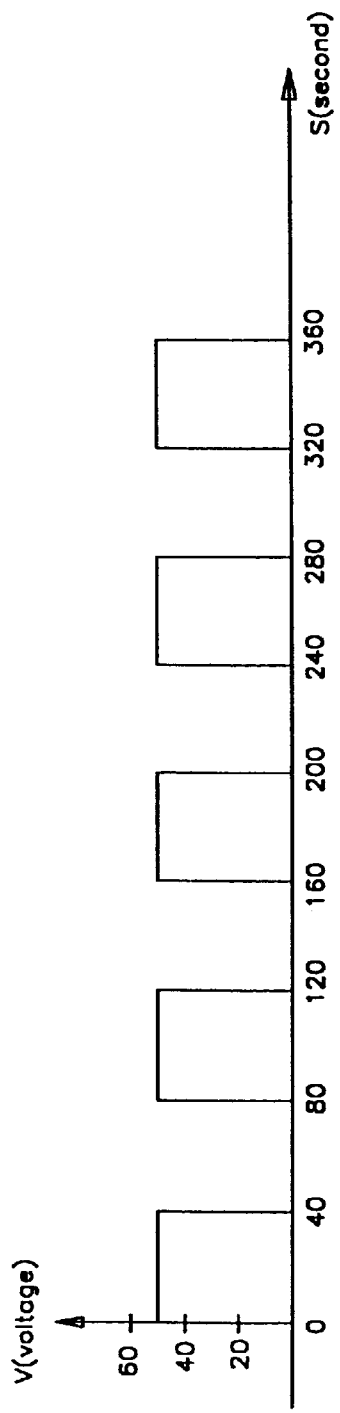
FIG. 11B shows the temperature change of the DUT under experimental conditions and power input as shown in FIG. 11A with temperature control and an elastomeric sheet provided between the DUT and the cooling module.
Figure 11B:
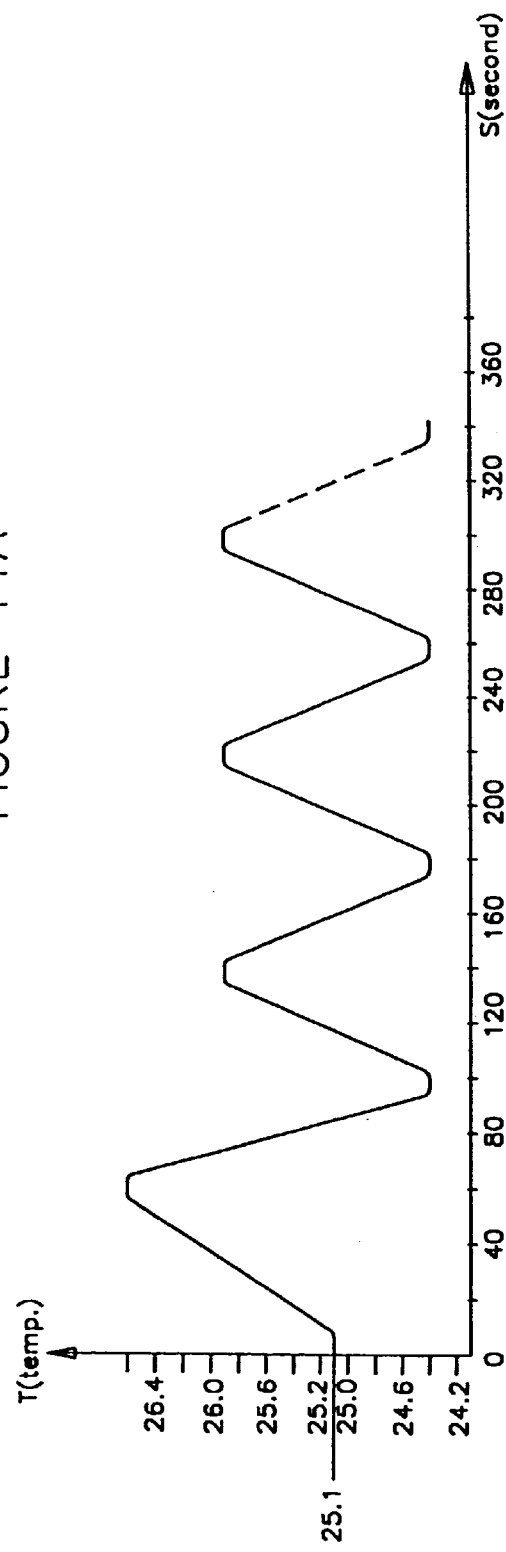

FIG. 9 shows the results when the 50V, 4.4 W power pulses were administered in 10-second durations with 10-second intervals between each pulse. When the power pulse is switched on, the heater plate temperature started to rise, but the rise was much smaller than the 1.5° C. experienced when 40-second pulses were used. The maximum temperature increase was 0.7° C. after 3 pulses at around 45 seconds, after which the control system was able to bring the temperature slowly back down to ambient temperature. This is because the thermal inertial of the control system is large enough to take care of the 10-second power pulse.

The above test results show that the duration of the power pulse has a great effect on the stability of the temperature control system. The longer the pulse duration, the greater the temperature fluctuation. For the application of IC package testing in test handlers, a 40-second pulse is considered a very demanding situation for the temperature control system, and therefore the following experiments were conducted using 40-second pulses.

EXPERIMENT 4

The previous experiments (Experiments 1–3) were all conducted with the heater plate in direct contact with the cold junction of the cooling module. These experiments were performed to measure the performance of the system under normal working conditions. In the actual application of temperature control for IC package test handlers, however, the packages are often warped during and after the packaging process, and cannot make direct contact with the flat cold function of the cooling module without an interface panel. This would have serious impact on the efficiency of heat flow from the IC device to the cooling module. Therefore, the following set of experiments were performed to find out whether the presence of an interface panel affects the performance of the system.

As a control experiment, an aluminum plate of 8 mm thickness and having the same surface area as that of the cold junction of the cooling module, is placed between the heater plate and the cooling module. Testing conditions were identical to the 40-second pulses performed in Experiment 3 (i.e. 50V 4.4 W pulses). FIG. 10 shows that the result of adding this aluminum plate caused the heating plate to rise a maximum of 1.60 C above ambient temperature in 55 seconds, but that the system was able to reduce the temperature fluctuation after the first pulse. This is only an additional rise of 0.1° C. compared to results obtained without the aluminum plate (FIG. 8). These results show that even if an additional panel is added between the DUT and the cold junction, the effectiveness of the temperature control system is not seriously compromised provided that the panel is made of a material with high thermal conductivity, for example aluminum or copper.

In the application of IC testing, however, a metallic plate (although possessing good thermal conductivity) cannot be used as the interface panel because this panel must have sufficient resilience to facilitate contact between the warped IC package and the flat cold junction. Therefore, a panel with elastomeric properties would be preferred. However, elastomers are well-known to have insulating properties, which would be undesirable in the present application. Thus, experiments were conducted to ascertain the effect of adding a elastomeric interface panel between the heating plate and the cold junction. FIG. 10 shows results of an experiment in which 40-second pulses of 50V, 4.4 W power were initiated in a heater plate. A 2 mm elastomeric T-Flex sheet (T-Flex 270 from Thermogon Company, USA, thermal conductivity 1.7W/m°C.) is added between the heater plate and the cold junction of the cooling module. When power is switched on at 0 sec, FIG. 10 shows that the temperature of the heater plate rose to 26.6° C., which was 1.5° C. above the ambient temperature of 25.1° C. The highest temperature occurred about 55 seconds after the power pulse was started. After that, the heater plate temperature fluctuated between 0.8° C. higher and lower than the ambient temperature. From this experiment, it was found that, unexpectedly, adding a thin T-Flex sheet has minimal effect on the temperature profile of the temperature control system in this specific example.

When two pieces of 2 mm T-Flex sheets were used (total of 4 mm) while other conditions were kept the same as those shown in the previous experiment, the heater plate rose to 3° C. above ambient temperature before being slowly controlled back to ambient temperature with compressed air sweeping across the heat sink. Temperature at the heat plate could not return to ambient level at all if compressed air was not activated. In addition, condensation started to occur on the cooling module during testing. This is most likely due to the poor heat transfer efficiency caused by the thick elastomeric interface resulting in a big temperature gradient between the cooling module and the testing plate.

From the experimental results shown above, it can be concluded that the thermal control system according to the present invention can react fast enough to catch up with the heater output change of the DUT and control the DUT temperature to within a relatively narrow range, even fi a thin layer of interface panel is used. This interface panel must have a measure of resilience and preferably with relatively high thermal conductivity. The purpose of this panel is to provide a proper interface between the flat surface of the cold junction and the body of the device to be cooled. This is necessary because devices such as IC packages are often warped during and after the packaging process, and would not independently provide a good contact surface for the cold junction to function properly. The exact thickness of the resilient sheet used as the interface panel depends on the thermal conductivity of the sheet and the actual requirements of the system, and may be determined based on the teaching described herein.

While the present invention has been described particularly with references to a test head of test handler for IC packages, it should be understood that the figures incorporated here are for illustration only and should not be taken as limitation on the invention. In addition, it is clear that the method and apparatus of the present invention has utility in many applications where automatic temperature control is required. It is contemplated that many changes and modifications may be made by one of ordinary skill in the art without departing from the spirit and scope of the invention described.

What is claimed is:

1. A heat dissipation system for controlling the temperature of a device, said system comprising:
   a) a power supply coupled to a feedback controller;
   b) a thermoelectric cooling module coupled to said power supply, said thermoelectric cooling module having a cold junction and a hot junction;
   c) a heat sink coupled to said hot junction;
   d) a resilient interface panel having a first side and a second side, said first side adapted for attachment to said cold junction, said second side adapted for engagement with a device for cooling; and
   e) a thermosensor coupled to said feedback controller, said thermosensor adapted for monitoring the temperature of a device for cooling
whereby the temperature of the device may be controlled.

2. A heat dissipation system for controlling the temperature of a device according to claim 1 wherein the interface panel is an elastomeric sheet.

3. A heat dissipation system for controlling the temperature of a device according to claim 2 wherein the thermal conductivity of the interface panel is higher or equal to 1.7W/m°C.

4. A heat dissipation system for controlling the temperature of a device according to claim 1 wherein the interface panel has the same surface area as the cooling module.

5. A heat dissipation system for controlling the temperature of a device according to claim 1 wherein the interface panel is 2 mm thick.

6. A heat dissipation system for controlling the temperature of a device according to claim 1 wherein a fan is further provided for cooling the heat sink.

7. A heat dissipation system for controlling the temperature of a device according to claim 1 wherein the thermosensor is a platinum resistance thermometer.

8. A heat dissipation system for controlling the temperature of a device according to claim 1 wherein the cooling module and the heat sink are attached to a nest of a test head of a test handler for IC devices.

9. A heat dissipation system for controlling the temperature of a device according to claim 8 wherein the nest contains at least one suction cup and pneumatic means for picking and placing IC devices.

10. A heat dissipation system for controlling the temperature of a device according to claim 8 wherein the interface panel is disposed adjacent to said suction cup and adapted for direct contact with a device to be tested when the device is picked up by the suction cup.

11. A heat dissipation system for controlling the temperature of a device according to claim 1 wherein the device is an IC device.

12. A heat dissipation system for controlling the temperature of a device according to claim 1 wherein compressed air is used to cool the heat sink.

13. A heat dissipation system for controlling the temperature of a device according to claim 1 wherein the thermosensor is attached to the cold junction.

14. A heat dissipation system for controlling the temperature of a device according to claim 1 wherein an additional metallic panel is disposed between the cold junction and the interface panel.

15. A heat dissipation system for controlling the temperature of a device according to claim 14 wherein the thermosensor is attached to the metallic panel.

16. A heat dissipation system for controlling the temperature of a device according to claim 3 wherein the interface panel is 2 mm thick.

17. A heat dissipation system for controlling the temperature of a device according to claim 2 wherein the interface panel has the same surface area as the cooling module.

18. A heat dissipation system for controlling the temperature of a device according to claim 2 wherein a fan is further provided for cooling the heat sink.

19. A heat dissipation system for controlling the temperature of a device according to claim 2 wherein the thermosensor is a platinum resistance thermometer.

20. A heat dissipation system for controlling the temperature of a device according to claim 2 wherein the cooling module and the heat sink are attached to a nest of a test head of a test handler for IC devices.

21. A heat dissipation system for controlling the temperature of a device according to claim 2 wherein the device is an IC device.

22. A heat dissipation system for controlling the temperature of a device according to claim 2 wherein compressed air is used to cool the heat sink.

23. A heat dissipation system for controlling the temperature of a device according to claim 2 wherein the thermosensor is attached to the cold junction.

24. A heat dissipation system for controlling the temperature of a device according to claim 2 wherein an additional metallic panel is disposed between the cold junction and the interface panel.

* * * * *